United States Patent [19]
Son

[11] Patent Number: 6,066,534
[45] Date of Patent: May 23, 2000

[54] METHOD OF MANUFACTURING A FIELD EFFECT TRANSISTOR

[75] Inventor: Jeong Hwan Son, Daejen-si, Rep. of Korea

[73] Assignee: LG Semicon Co., Ltd., Chungcheongbuk-do, Rep. of Korea

[21] Appl. No.: 08/851,092

[22] Filed: May 5, 1997

[30] Foreign Application Priority Data

Jul. 31, 1996 [KR] Rep. of Korea ...................... 31659/96

[51] Int. Cl.⁷ .............................................. H01L 21/8238
[52] U.S. Cl. ........................ 438/299; 438/286; 438/305; 438/592; 438/595
[58] Field of Search .................................... 438/299, 301, 438/303, 304, 305, 306, 307, 585, 592, 595, 596, FOR 190, FOR 188, FOR 175, 286

[56] References Cited

U.S. PATENT DOCUMENTS

| | | | |
|---|---|---|---|
| 4,419,809 | 12/1983 | Riseman et al. ........................ | 438/231 |
| 4,442,589 | 4/1984 | Doo et al. ................................ | 438/297 |
| 4,597,827 | 7/1986 | Nishitani et al. ........................ | 438/231 |
| 4,971,922 | 11/1990 | Watabe et al. ........................... | 438/304 |
| 5,202,272 | 4/1993 | Hsieh et al. ............................. | 438/305 |
| 5,244,823 | 9/1993 | Adan ....................................... | 438/304 |
| 5,391,510 | 2/1995 | Hsu et al. ................................ | 438/305 |
| 5,459,091 | 10/1995 | Hwang .................................... | 438/264 |

FOREIGN PATENT DOCUMENTS

60-066861   4/1985   Japan ..................... 438/190

*Primary Examiner*—Michael Trinh
*Attorney, Agent, or Firm*—Morgan, Lewis & Bockius LLP

[57] ABSTRACT

A field effect transistor includes a semiconductor substrate; a gate insulating film on the semiconductor substrate; a first impurity region and a second impurity region formed in a surface of the substrate; an lightly doped region in contact with the first impurity region and formed toward the second impurity region in the semiconductor substrate; and an L-shaped gate electrode on the semiconductor substrate extending between the lightly doped region and the second impurity region.

11 Claims, 8 Drawing Sheets

METHOD OF MANUFACTURING A FIELD EFFECT TRANSISTOR

BACKGROUND OF THE INVENTION

1. Field of the Invention

The present invention relates to a field effect transistor and a method of manufacturing the same, and more particularly, to a field effect transistor and a method of manufacturing the same with reduced gate sheet resistance.

2. Discussion of the Related Art

In general, a highly integrated semiconductor device includes a large number of field effect transistors. In order to increase the degree of integration, the field effect transistors are formed with a very small size. As the transistor size becomes smaller, the sheet resistances of source/drain and gate of the field effect transistor increase. This results in a delay of signal transfer in the integrated circuit. If the sheet resistances related to the source/drain and the gate decrease, the signal transfer time can be reduced. Another problem caused by high integration is that a contact resistance increases as the contact region of the gate, source/drain, and an interconnection layer decreases. This also delays the signal transfer time.

Hereinafter, a conventional field effect transistor and a method of manufacturing the same will be described with reference to FIG. 1 and FIGS. 2a to 2f.

Figure 1:
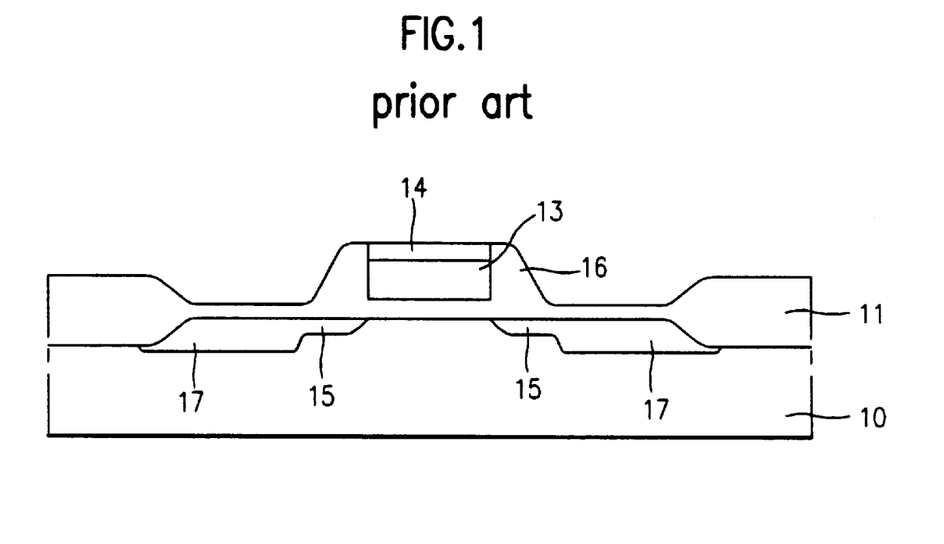
FIG. 1 is a cross-sectional view of a conventional field effect transistor.

As shown in FIG. 1, the conventional field effect transistor includes a silicon substrate 10, a field oxide film 11 formed on the silicon substrate 10, a gate formed on an active region of the silicon substrate including a polysilicon film 13 and a silicide film 14, sidewall spacers 16 formed at both sides of the gate, lightly doped drain (LDD) regions 15 formed on the surface of the silicon substrate 10 below the sidewall spacers 16, and source/drain regions 17 formed to be in contact with the LDD regions 15. The source/drain regions 17 extend over the surface of the silicon substrate 10 at respective sides of the sidewall spacers 16.

Figure 2A:
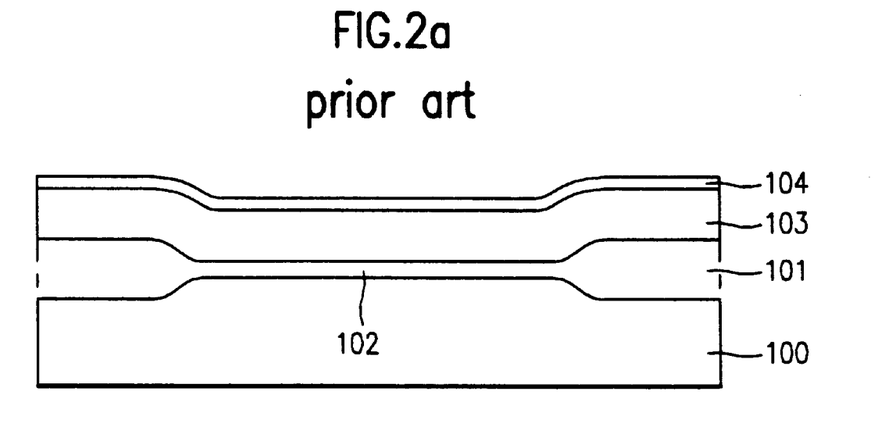
FIGS. 2a to 2f are cross-sectional views illustrating a method of manufacturing the conventional field effect transistor.

A method of manufacturing the above field effect transistor will now be described with reference to FIGS. 2a to 2f. As shown in FIG. 2a, a field oxide film 101 is formed on a P-type silicon substrate 100. A gate insulating film 102, a polysilicon film 103 and a silicide film 104 are successively stacked on the entire surface of the P-type silicon substrate 100.

Figure 2B:
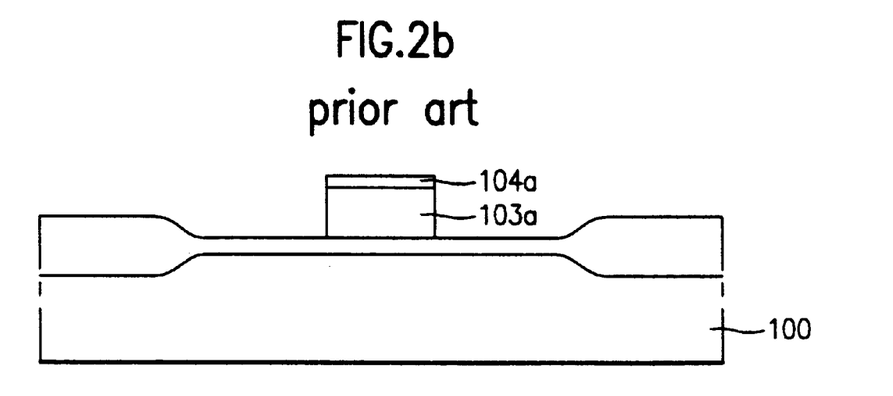
Figure 2C:
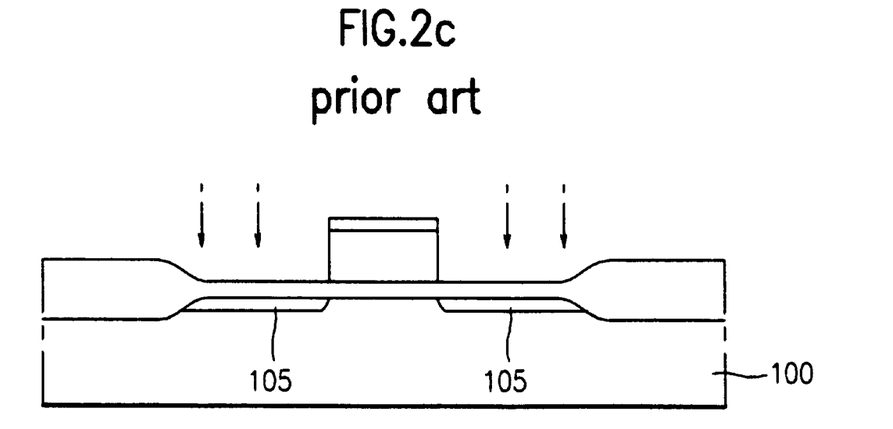

As shown in FIG. 2b, through a photo/etching process utilizing a gate mask, the silicide film 104 and polysilicon film 103 are sequentially patterned to form gate electrodes 103a and 104a. As shown in FIG. 2c, using the gate electrode as a mask, an ion implantation with a low concentration is carried out to form n⁻LDD regions 105.

Figure 2D:
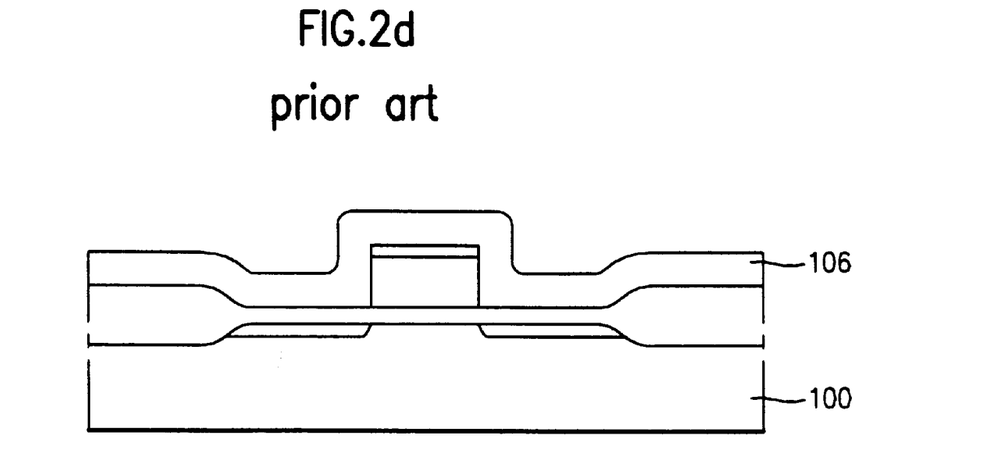
Figure 2E:
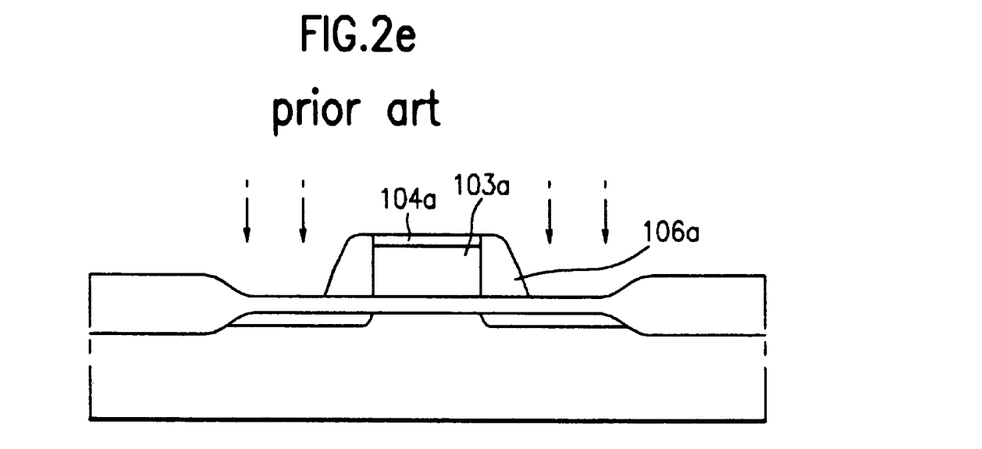
Figure 2F:
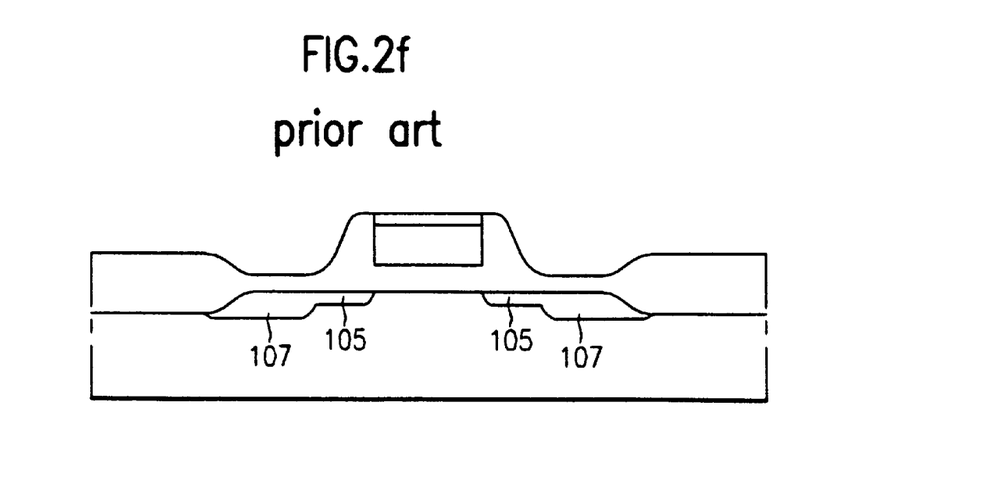

As shown in FIG. 2d, an insulating film 106 is deposited over the entire surface of the silicon substrate 100. As shown in FIG. 2e, an anisotropic etching process is carried out on the insulating film 106 to form sidewall spacers 106a at both sides of the gate electrodes 103a and 104a. As shown in FIG. 2f, source/drain regions 107 are formed at the sides of the n⁻LDD regions 105.

According to the aforementioned conventional method, it is difficult to form a gate with a short gate length. In addition, the LDD region is unnecessarily formed in the source region.

This leads to a deterioration of the current characteristics as the resistance increases. Furthermore, since a silicide layer is used to reduce the resistance of the gate, if the gate length is short, the resistance reducing effect due to the silicide layer is lessened.

SUMMARY OF THE INVENTION

Accordingly, the present invention is directed to a field effect transistor and a method of manufacturing the same that substantially obviates one or more of the problems due to limitations and disadvantages of the related art.

An object of the present invention is to provide a field effect transistor and a method of manufacturing the same with reduced gate sheet resistance.

Another object of the present invention is to reduce the gate length without increasing the gate sheet resistance.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the field effect transistor of the present invention includes a semiconductor substrate; a gate insulating film on the semiconductor substrate; a first impurity region and a second impurity region formed at regular intervals in the surface of the substrate; an LDD region that is in contact with the first impurity region and formed toward the second impurity region in the surface of the semiconductor substrate; and an L-shaped gate electrode formed so as to be extended between the LDD region and the second impurity region on the surface of the semiconductor substrate. It is preferable that the L-shaped gate electrode comprises a double-layered structure having an impurity-doped polysilicon layer with an L-shape and an L-shaped silicide layer. Here, at least part of the L-shaped silicide layer is formed on the polysilicon layer.

In another aspect, the method of manufacturing a field effect transistor according to the present invention includes the steps of forming a gate insulating film and a first insulating film on a semiconductor substrate and patterning the first insulating film to form a first insulating film pattern; sequentially stacking a first conductor, a second conductor, and a second insulating film on the semiconductor substrate and the first insulating film pattern; anisotropically etching the second insulating film, the second conductor and the first conductor to form a gate electrode on both sides of the first insulating film pattern, the gate electrode being composed of a L-shaped first conductor pattern, a L-shaped second conductor pattern and a second insulating film pattern; removing the first insulating film pattern on the semiconductor substrate; implanting a low concentration impurity in the surface of the semiconductor substrate, using the gate electrode as an ion-implantation mask, to form a low concentration impurity region; forming a layer for spacer on the semiconductor substrate and the gate electrode and etching the layer to form a sidewall spacer on the side of the gate electrode; implanting an impurity in the surface of the semiconductor substrate, using the gate electrode and the sidewall spacer as an ion-implantation mask, to form high concentration impurity regions; and removing the second insulating pattern.

In a further aspect, the method of manufacturing a field effect transistor includes the steps of forming a gate insulating film and a first insulating film on a semiconductor substrate and patterning the first insulating film to form a first insulating film pattern; sequentially depositing a first conductor and a second insulating film on the semiconductor substrate and the first insulating film pattern; anisotropically etching the second insulating film and the first conductor to form a gate electrode on both sides of the first insulating film pattern, the gate electrode being composed of a L-shaped first conductor pattern and a second insulating film pattern; removing the first insulating film pattern on the semiconductor substrate; implanting a low concentration impurity in the surface of the semiconductor substrate, using the gate electrode as an ion-implantation mask, to form low concentration impurity regions; forming a layer for spacer on the semiconductor substrate and the gate electrode and etching the layer to form sidewall spacers on both sides of the gate electrode; implanting an impurity in the surface of the semiconductor substrate, using the gate electrode and the sidewall spacers as an ion-implantation mask, to form high concentration impurity regions; and removing the second insulating pattern and performing a silicide process to form a silicide.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 3:
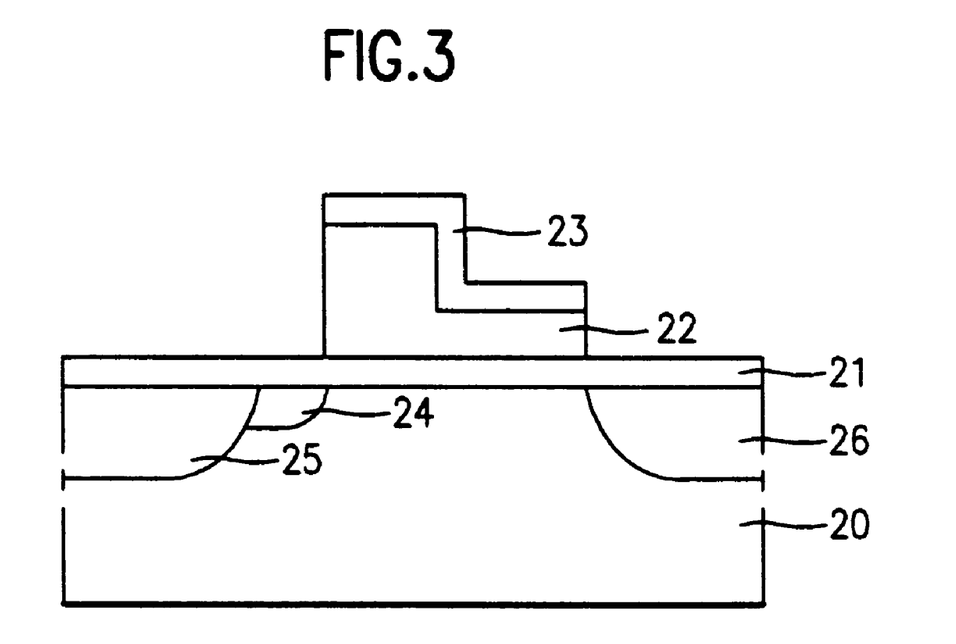
FIG. 3 is a cross-sectional view showing a field effect transistor according to the present invention.

FIG. 3 is a cross-sectional view of a field effect transistor according to the present invention. As shown in FIG. 3, in the field effect transistor of the present invention, a gate insulating film 21 is formed on a silicon substrate 20. A source 26 and a drain 25 are formed at regular intervals in the silicon substrate 20. An LDD region 24 is formed to be in contact with the drain 25, toward the source 26. A gate electrode 22 is formed on the surface of the silicon substrate 20 so that it includes a vertical body perpendicular to the surface of the silicon substrate 20 and a horizontal body parallel to the surface of the silicon substrate 20. Furthermore, a silicide layer 23 is formed on the overall upper surface of the gate electrode 22 and becoming a part of the gate electrode 22.

Figure 4A:
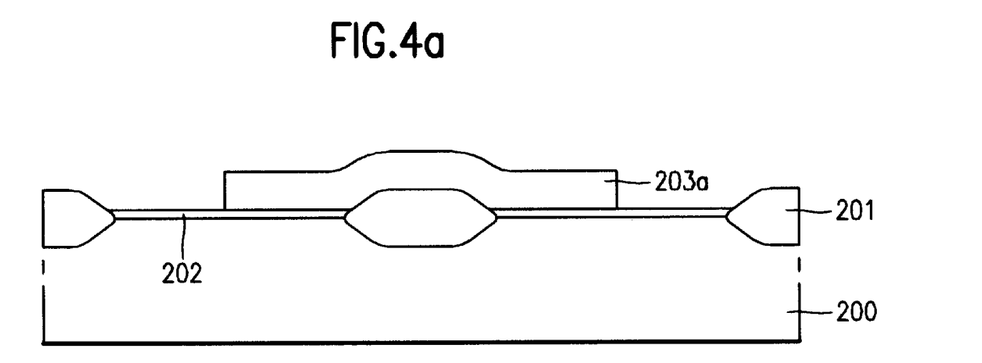
FIGS. 4a to 4g are cross-sectional views illustrating a method of manufacturing a field effect transistor according to a first embodiment of the present invention.

FIGS. 4a to 4g are cross-sectional views illustrating a method of manufacturing a field effect transistor, according to a first embodiment of the present invention. As shown in FIG. 4a, a field oxide film 201 is formed on a p-type silicon substrate 200. A gate insulating film 202 and a nitride film are sequentially formed on the p-type silicon substrate 200. The nitride film is then patterned to form a nitride film pattern 203a.

Figure 4B:
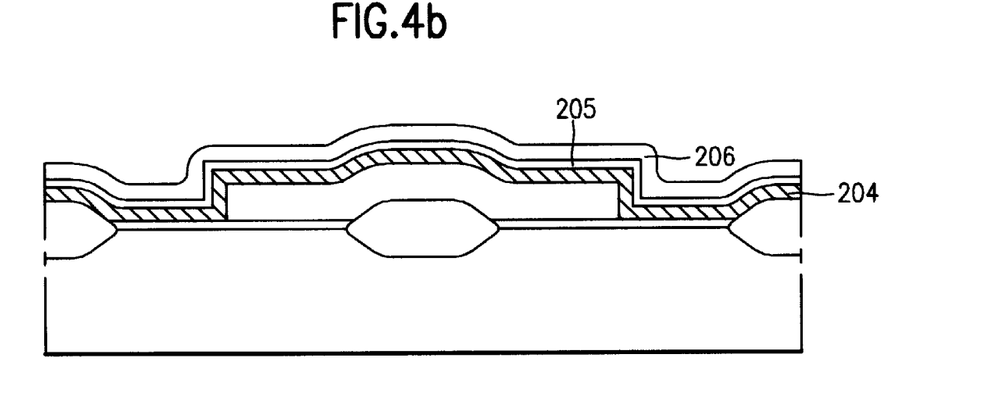
Figure 4C:
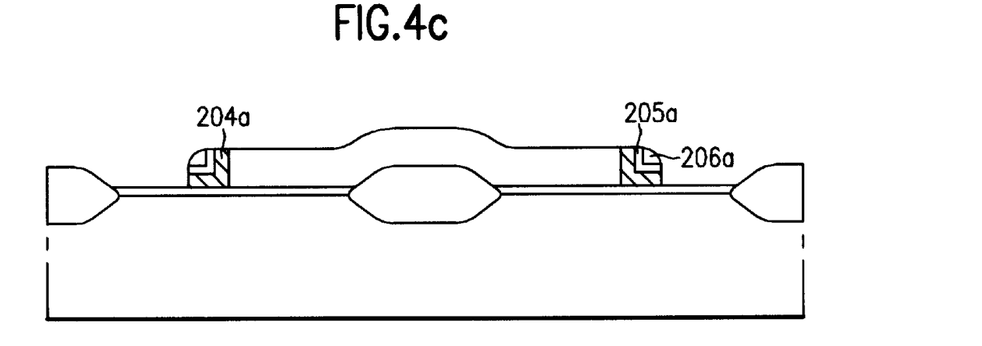

As shown in FIG. 4b, a polysilicon film 204, a silicide film 205, and a first insulating film 206 are sequentially deposited on the surface of the nitride film pattern 203a and the p-type silicon substrate 200. As shown in FIG. 4c, the first insulating film 206, the silicide film 205, and the polysilicon film 204 are sequentially anisotropically etched, thereby forming first insulating film patterns 206a, L-shaped silicide film patterns 205a, and L-shaped polysilicon film patterns 204a.

Figure 4D:
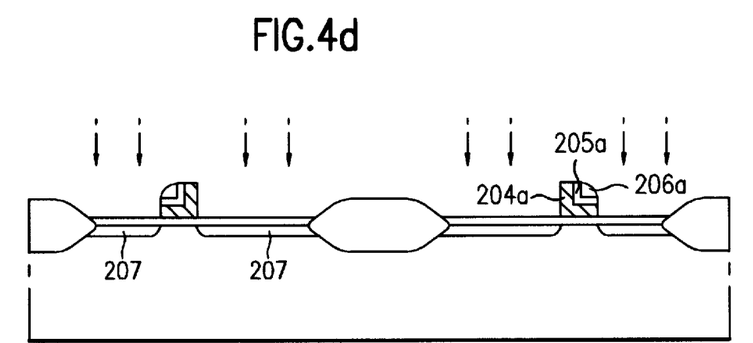

As shown in FIG. 4d, the nitride film pattern 203a on the p-type silicon substrate 200 is removed. In order to form LDD regions 207, using the first insulating film patterns 206a, silicide film patterns 205a and polysilicon film patterns 204a as a mask, impurity ions, e.g., phosphorus (P) or arsenic (As) ions, are implanted at a low concentration through the exposed surface of the p-type silicon substrate 200.

Figure 4E:
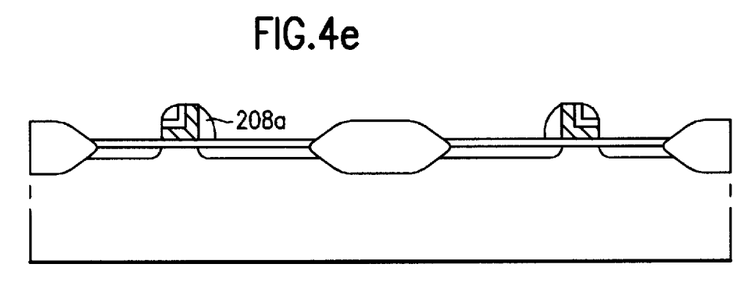

As shown in FIG. 4e, a second insulating film 208 is formed on the entire surface of the p-type silicon substrate and etched to form sidewall spacers 208a.

Figure 4F:
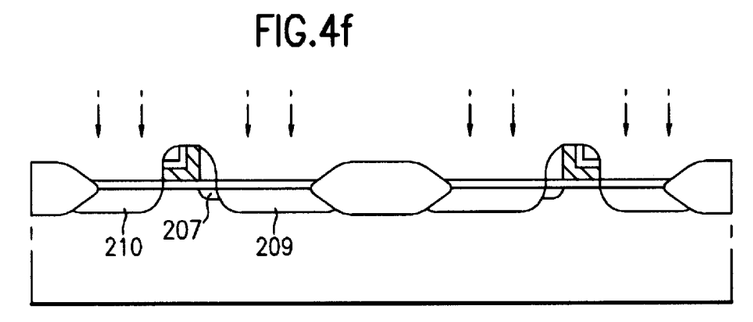

As shown in FIG. 4f, using the first insulating film patterns 206a, silicide film patterns 205a, polysilicon film patterns 204a, and sidewall spacers 208a as a mask, impurity ions, e.g., P or As ions, with a high concentration are implanted through the exposed p-type silicon substrate 200, thereby forming source regions 210 and drain regions 209.

Figure 4G:
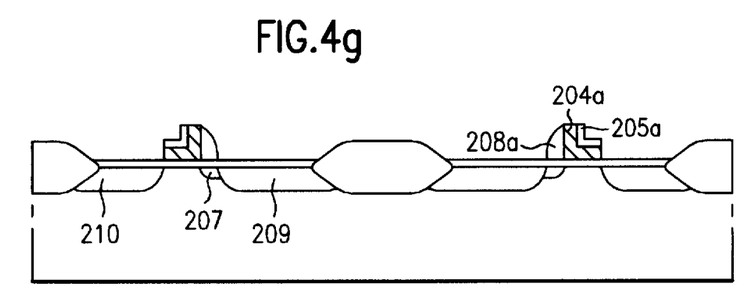

Finally, as shown in FIG. 4g, the first insulating film patterns 206a are removed by an etching process, thereby forming a gate electrode with an L-shaped silicide film 205a and an L-shaped polysilicon film 204a. The gate electrode is formed in a way so that the sidewall spacers 208a and the LDD region are formed only at the side of the drain.

Figure 5A:
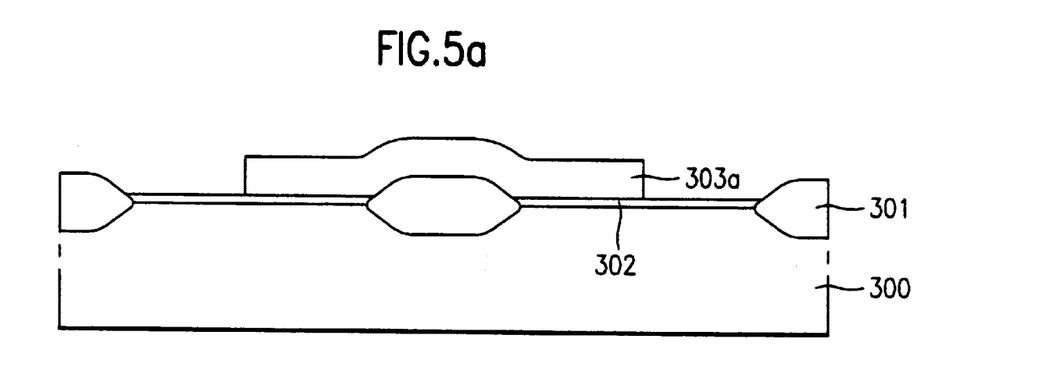
FIGS. 5a to 5g are cross-sectional views illustrating a method of manufacturing a field effect transistor according to a second embodiment of the present invention.

FIGS. 5a to 5g are cross-sectional views illustrating a method of manufacturing a field effect transistor, according to a second embodiment of the present invention. As shown in FIG. 5a, a field oxide film 301 is formed on a p-type silicon substrate 300. A gate insulating film 302 and a nitride film are sequentially formed on the p-type silicon substrate 300. The nitride film is patterned to form a nitride film pattern 303a.

Figure 5B:
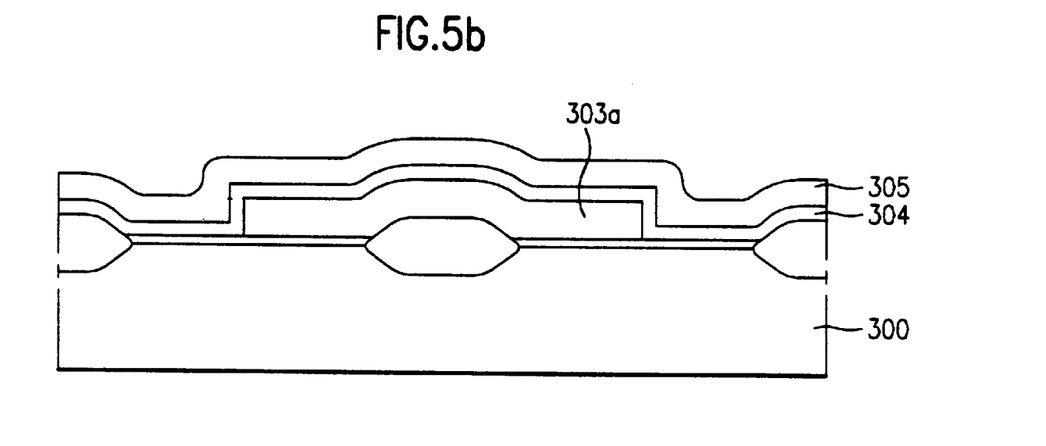
Figure 5C:
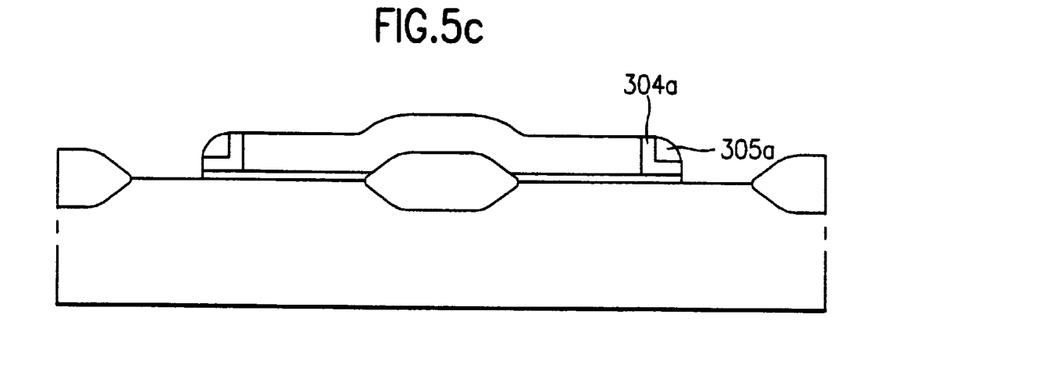

As shown in FIG. 5b, a polysilicon film 304 and an insulating film 305 are sequentially deposited on the entire surface of the nitride film pattern 303a and the p-type silicon substrate 300. As shown in FIG. 5c, the insulating film 305 and the polysilicon film 304 are anisotropically etched to form insulating film patterns 305a and L-shaped polysilicon film patterns 304a.

Figure 5D:
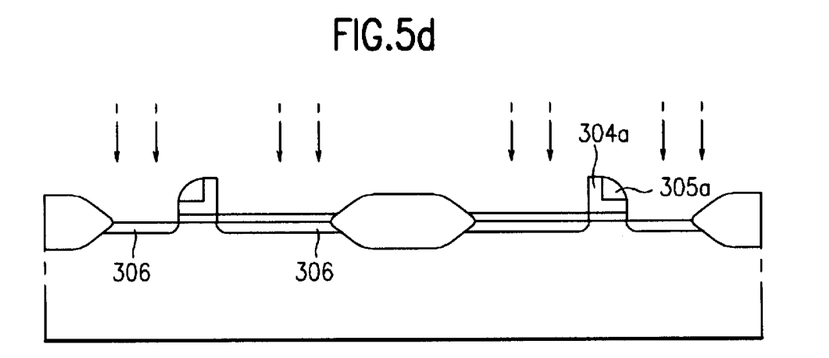

As shown in FIG. 5d, the nitride film 303a is removed by selective etching, for example. Using the insulating film patterns 305a and polysilicon film patterns 304a as a mask, impurity ions, e.g., P or As ions, are implanted at a low concentration, thereby forming LDD regions 306 at the exposed surface of the p-type silicon substrate 300.

Figure 5E:
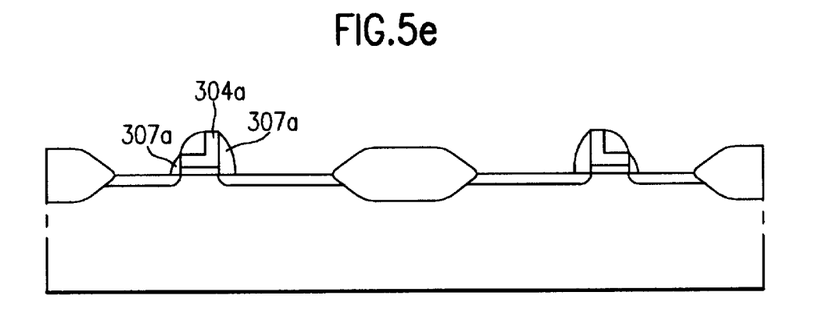

As shown in FIG. 5e, a spacer layer is formed on the entire surface of the p-type silicon substrate and anisotropically etched to form sidewall spacers 307a at both sides of the polysilicon film pattern 304.

Figure 5F:
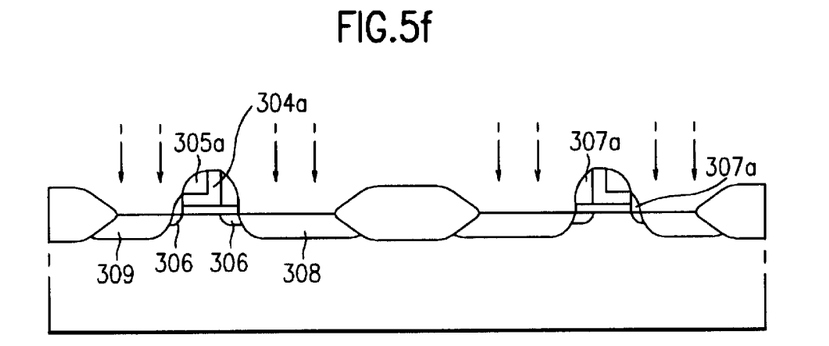

As shown in FIG. 5f, using insulating film patterns 305a, polysilicon film patterns 304a, and sidewall spacers 307a as a mask, impurity ions, e.g., P or As ions, are implanted with a high concentration through the exposed p-type silicon substrate, thereby forming source regions 309 and drain regions 308 at respective sides of the LDD regions 306.

Figure 5G:
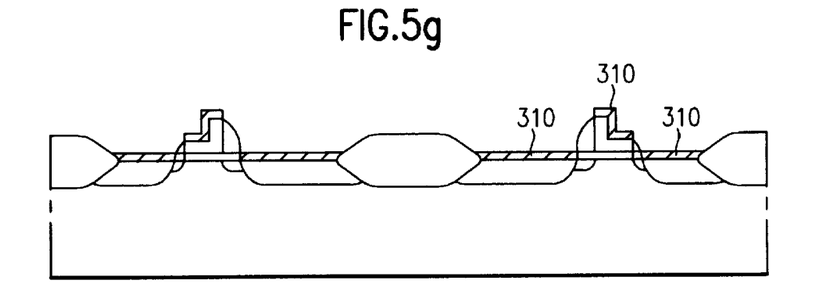

Finally, as shown in FIG. 5g, after removing the insulating film patterns 305a, a silicide 310 is formed by a silicide process on the polysilicon film patterns 304a and the substrate 300.

Accordingly, the method of the present invention is capable of manufacturing a device with a short gate length. Since the gate is formed with the L-shaped structure, the transistor has a reduced gate sheet resistance due to the increased area where silicide is formed. Furthermore, in the first embodiment, the LDD region is formed only on the drain side and the LDD region on the source side is eliminated. In the second embodiment, the LDD region in the source side is considerably reduced. As a result, the source resistance is decreased and the current characteristics is improved.

It will be apparent to those skilled in the art that various modifications and variations can be made in the field effect transistor and the method of manufacturing the same of the present invention without departing from the spirit or scope of the invention. Thus, it is intended that the present invention cover the modifications and variations of this invention provided they come within the scope of the appended claims and their equivalents.

What is claimed is:

1. A method of manufacturing a field effect transistor, the method comprising the steps of:

forming a gate insulating film on a semiconductor substrate;

forming a first insulating film on the gate insulating film and patterning the first insulating film to form a first insulating film pattern;

sequentially stacking a first conducting film, a second conducting film, and a second insulating film over the semiconductor substrate and the first insulating film pattern;

etching the second insulating film, the second conducting film, and the first conducting film to form at least one L-shaped gate electrode and a second insulating film pattern at a side of the first insulating film pattern, the L-shaped gate electrode including an L-shaped first conducting film pattern and an L-shaped second conducting film pattern, the second insulating film pattern being formed on the L-shaped gate electrode;

removing the first insulating film pattern;

implanting a first impurity through a surface of the semiconductor substrate using the L-shaped gate electrode as a mask to form first concentration impurity regions;

forming a sidewall spacer at one side of the L-shaped gate electrode;

implanting a second impurity through the surface of the semiconductor substrate using the L-shaped gate electrode and the sidewall spacer as a mask to form second concentration impurity regions; and removing the second insulating pattern.

2. The method according to claim 1, wherein the first insulating film includes an oxide film, and the second insulating film includes a nitride film.

3. The method according to claim 1, wherein the first insulating film includes a nitride film and the second insulating film includes an oxide film.

4. The method according to claim 1, wherein the sidewall spacer includes an oxide film.

5. A method of manufacturing a field effect transistor, the method comprising the steps of:

forming a gate insulating film on a semiconductor substrate;

forming a first insulating film pattern on the gate insulating film;

sequentially depositing a first conducting film and a second insulating film over the semiconductor substrate and the first insulating film pattern;

etching the second insulating film and the first conducting film to form at least one L-shaped gate electrode and a second insulating film pattern at a side of the first insulating film pattern, the second insulating film pattern being formed on the L-shaped gate electrode;

removing the first insulating film pattern;

implanting a first concentration impurity through a surface of the semiconductor substrate using the L-shaped gate electrode as a mask to form first concentration impurity regions;

forming a sidewall spacer at a side of the L-shaped gate electrode;

implanting a second concentration impurity through the surface of the semiconductor substrate using the gate electrode and the sidewall spacer as a mask to form second concentration impurity regions;

removing the second insulating film pattern; and forming an L-shaped silicide layer directly on the L-shaped gate electrode.

6. The method according to claim 5, further comprising the steps of forming a second sidewall spacer at a second side of the L-shaped gate electrode before the step of implanting the second concentration impurity to form lightly doped regions adjacent respective second concentration impurity regions.

7. The method according to claim 5, wherein the first insulating film pattern includes an oxide film and the second insulating film includes a nitride film.

8. The method according to claim 5, wherein the first insulating film pattern includes a nitride film and the second insulating film includes an oxide film.

9. The method according to claim 5, wherein the sidewall spacers include an oxide film.

10. A method of manufacturing a transistor, the method comprising the steps of:

forming a first insulating film pattern on a substrate;

forming an L-shaped gate electrode at both sides of the insulating film pattern, wherein the step of forming the L-shaped gate electrode includes the steps of sequentially forming a first conductive layer and an insulating layer on the substrate and the insulating film pattern and anisotropically etching the first conductive layer and the insulating layer to form the L-shaped first conductive film pattern and an additional insulating film pattern;

removing the first insulating film pattern;

forming a lightly doped region by implanting an impurity through a surface of the substrate by using the L-shaped first conductive film pattern and the additional insulating film pattern as a mask;

forming a sidewall spacer at one side of the L-shaped first conductive film pattern corresponding to the light doped region;

forming impurity regions in the substrate; and removing the additional insulating film pattern and forming the L-shaped second conductive film pattern directly upon the L-shaped first conductive film pattern.

11. The method according to claim 10, wherein the step of forming the impurity regions includes implanting an impurity through the surface of the substrate by using the L-shaped first conductive film pattern and the sidewall spacer as a mask.

* * * * *